United States Patent
Keller (10) Patent No.: US 10,192,663 B2
(45) Date of Patent: Jan. 29, 2019

(54) COIL FOR A SWITCHING DEVICE WITH A HIGH-FREQUENCY POWER

(71) Applicant: Rohde & Schwarz GmbH & Co. KG, Munich (DE)

(72) Inventor: Klaus Keller, Isen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/904,774

(22) PCT Filed: Jun. 10, 2014

(86) PCT No.: PCT/EP2014/061957
§ 371 (c)(1),
(2) Date: Jan. 13, 2016

(87) PCT Pub. No.: WO2015/007433
PCT Pub. Date: Jan. 22, 2015

(65) Prior Publication Data
US 2016/0155552 A1    Jun. 2, 2016

(30) Foreign Application Priority Data

Jul. 17, 2013  (DE) ................. 10 2013 213 981

(51) Int. Cl.
*H01F 5/02* (2006.01)
*H01F 27/00* (2006.01)
(Continued)

(52) U.S. Cl.
CPC ............ *H01F 5/02* (2013.01); *H01F 27/006* (2013.01); *H03K 17/74* (2013.01); *H01F 2005/006* (2013.01); *H04B 1/48* (2013.01)

(58) Field of Classification Search
None
See application file for complete search history.

(56) References Cited

U.S. PATENT DOCUMENTS 1,231,875 A    7/1917    Gifford et al.
2,141,869 A *  12/1938   Konig ............... B01D 67/0032
                                                          219/384

(Continued)

FOREIGN PATENT DOCUMENTS

CN    101308946 A    10/2012
DE      2118084 B    10/1972
(Continued)

OTHER PUBLICATIONS

Relative Permittivity—the Dielectric Constant, The Engineering ToolBox, www.engineeringtoolbox.com/relative-permittivity-d_1660.html, accessed on Mar. 19, 2018.*

(Continued)

*Primary Examiner* — Thomas J. Hiltunen
(74) *Attorney, Agent, or Firm* — Renaissance IP Law Group, LLP; David A. Crowther (57) ABSTRACT

A coil provides several windings. A first winding is a winding at one edge of the coil, which provides a given first winding diameter and a given first winding spacing relative to the next winding. At the other end of the coil, a last winding provides a given second winding diameter and a given second winding spacing relative to the adjacent winding. In this context, the first winding diameter is larger than the second winding diameter. The first winding spacing in this context is smaller than the second winding spacing.

22 Claims, 5 Drawing Sheets

(51) Int. Cl.
*H03K 17/74* (2006.01)
*H04B 1/48* (2006.01)
*H01F 5/00* (2006.01)

(56) References Cited

U.S. PATENT DOCUMENTS

| | | | |
|---|---|---|---|
| 2,163,644 A | 6/1939 | Ware | |
| 2,422,458 A * | 6/1947 | Amy | H01Q 1/16 |
| | | | 174/208 |
| 2,425,304 A * | 8/1947 | Combs | H01F 21/005 |
| | | | 242/602 |
| 2,442,776 A * | 6/1948 | Newkirk | H01F 17/02 |
| | | | 29/605 |
| 2,653,992 A * | 9/1953 | Hill | H01C 1/14 |
| | | | 174/138 F |
| 2,982,888 A | 5/1961 | Whearley | |
| 3,159,907 A | 12/1964 | Bloom | |
| 4,161,737 A | 7/1979 | Albright | |
| 4,489,276 A | 12/1984 | Yu | |
| 4,882,591 A * | 11/1989 | Galvin | H01Q 1/1214 |
| | | | 343/715 |
| 5,321,965 A * | 6/1994 | Baird | B21F 3/04 |
| | | | 72/142 |
| 5,483,208 A * | 1/1996 | Spriester | H01F 17/045 |
| | | | 333/131 |
| 5,914,544 A * | 6/1999 | Tanaka | H01P 1/15 |
| | | | 307/130 |
| 6,236,289 B1 | 5/2001 | Slenker | |
| 6,339,364 B1 | 1/2002 | Reddy et al. | |
| 6,441,795 B1 * | 8/2002 | Volman | H01Q 13/02 |
| | | | 343/786 |
| 6,509,821 B2 * | 1/2003 | Oldfield | H01F 37/00 |
| | | | 336/200 |
| 6,803,848 B2 * | 10/2004 | Yeo | H01L 28/10 |
| | | | 257/E21.022 |
| 6,889,563 B2 | 5/2005 | Tomita et al. | |
| 7,327,143 B2 * | 2/2008 | Martin | G01R 33/34 |
| | | | 324/318 |
| 7,443,279 B2 * | 10/2008 | Yagisawa | H01F 5/00 |
| | | | 333/185 |
| 7,460,844 B2 * | 12/2008 | Molnar | H03D 7/1441 |
| | | | 455/130 |
| 7,570,143 B2 | 8/2009 | Adunka et al. | |
| 7,928,824 B2 * | 4/2011 | Jow | H01F 17/0013 |
| | | | 336/200 |
| 8,072,773 B2 * | 12/2011 | Mruz | H01F 17/04 |
| | | | 345/160 |
| 8,149,023 B2 * | 4/2012 | Rajagopalan | H03K 17/6872 |
| | | | 327/108 |
| 8,196,466 B2 | 6/2012 | Beneker et al. | |
| 8,324,966 B2 * | 12/2012 | Goldfarb | H03F 3/211 |
| | | | 330/124 R |
| 8,513,997 B2 * | 8/2013 | Hesen | H03K 21/08 |
| | | | 327/172 |
| 8,638,540 B2 * | 1/2014 | Burrows | H01T 13/50 |
| | | | 361/247 |
| 8,731,410 B2 * | 5/2014 | Welch | H04L 25/0272 |
| | | | 330/295 |
| 8,884,838 B2 | 11/2014 | Contreras et al. | |
| 9,059,491 B2 | 6/2015 | Lim et al. | |
| 9,246,436 B2 * | 1/2016 | Lemkin | H03D 7/1441 |
| 2002/0057183 A1 | 5/2002 | Oldfield | |
| 2002/0113667 A1 | 8/2002 | Tahara et al. | |
| 2005/0093670 A1 | 5/2005 | Neumann et al. | |
| 2007/0094863 A1 | 5/2007 | Ogawa et al. | |
| 2008/0231402 A1 | 9/2008 | Jow et al. | |
| 2010/0001810 A1 | 1/2010 | Charley et al. | |
| 2010/0170783 A1 * | 7/2010 | Wesner | B32B 5/00 |
| | | | 204/290.07 |
| 2012/0150016 A1 * | 6/2012 | Rathee | G01R 33/341 |
| | | | 600/411 |
| 2012/0319797 A1 | 12/2012 | Tamaru | |
| 2015/0157385 A1 * | 6/2015 | Schwagten | A61B 18/10 |
| | | | 606/31 |
| 2017/0069418 A1 | 3/2017 | Yamakita | |

FOREIGN PATENT DOCUMENTS

| | | |
|---|---|---|
| DE | 3433003 A1 | 3/1986 |
| DE | 4241604 A1 | 6/1994 |
| DE | 4342249 A1 | 6/1994 |
| DE | 102010009227 A1 | 6/2011 |
| JP | H10-93472 A | 10/1998 |
| JP | 2004-266047 A | 9/2004 |
| WO | 1998006113 A1 | 2/1998 |
| WO | 2014180493 A1 | 11/2014 |
| WO | 2015-007433 A1 | 1/2015 |

OTHER PUBLICATIONS

Product Information Datasheet for Rohacell HF Polymethacrylimide Foam, Evonik Industries, Jan. 2011.*
R. Cory et al., "Solid State RF/Microwave Switch Technology: Part 2," Jun. 2009, pp. 34, 38, 60, 62, 66.
"The PIN Diode Circuit Designers' Handbook," 1998, Microsemi-Watertown.
Int'l Search Report for WO 2015/007433.
Int'l Prelim. Report on Patentability, PCT/EP2014/061957, dated Jan. 28, 2016, (translated to English).
Int'l Search Report for PCT/EP2013/059364.
Jian-Zhoa Tong et al: "A wide stopband branch-line coupler using defected ground structure", Microwave and Millimeter Wave Technology (ICMMT), 2010 International Conference On, IEEE, Piscataway, NJ, USA, May 8, 2010 (May 8, 2010, pp. 66-69, XP031717509, ISBN 978-1-4244-5705-2.
L. H. Weng et al: "An Overview on Defected Ground Structure", Progress in Electromagnetics Research B, Jan. 1, 2008 (Jan. 1, 2001), pp. 173-189, XP55053557, Retrieved from the Internet.
Lim Jong-Sik-et al: "Design of 10 dB 90 DEG branch coupler using microstrip line with defected ground structure", Electronics Letters, IEE Stevenage, GB, vol. 36, No. 21, Oct. 12, 2000 (Oct. 12, 2000), pp. 1784-1785, XP006015792, ISSN: 0013-5194, DOI: 10.1049/EL:20001238.

* cited by examiner

COIL FOR A SWITCHING DEVICE WITH A HIGH-FREQUENCY POWER

CROSS-REFERENCES TO RELATED APPLICATIONS

This application claims the benefit under 35 U.S.C. § 119(a)-(b) and 35 U.S.C. § 365(a)-(b) to International Patent Application No. PCT/EP2014/061957 (published as WO 2015/007433 A1), which was filed on Jun. 10, 2014, and to German Patent Application No. 10 2013 213 981.0, which was filed on Jul. 17, 2013. Both of those applications are hereby incorporated by reference herein in their entireties.

TECHNICAL FIELD

The present disclosure relates generally to a coil for a switching device with a high-frequency power, to a switching device incorporating such a coil, to a coil former used to form such a coil, and to a process for making such a coil.

SUMMARY

Disclosed herein are embodiments of methods, apparatus, and systems related to a coil for a switching device with a high-frequency power. For example, a coil provides a high power-carrying capacity in the high-frequency range. Furthermore, a switching device is disclosed which uses such a coil for the supply of control signals.

Coils are conventionally used for the supply of bias voltages to control PIN diodes in RX/TX switches in order to prevent high-frequency components from draining from the connected branch. These are conventionally filled with an iron core in order to achieve desired, favorable electrical properties. However, in the case of high transmission powers, the problem arises that the coils used hitherto do not provide an adequate power-carrying capacity.

Furthermore, it is known that a combination of differently sized coils and capacitors can be used in order to achieve a broad bandwidth. In this context, resonances occur which influence the high-frequency path. In this case, one possibility is to attenuate the resonances of the coil with parallel resistors. However, this solution is not acceptable because of the high losses in the case of large powers. U.S. Pat. No. U.S. 6,236,289 B1, for example, shows an iron-filled coil as described above. The disadvantage in this context is the low power-carrying capacity described.

Embodiments are disclosed herein based upon the object of providing a coil and a switching device suitable for supplying control signals and at the same time providing a very high power-carrying capacity. This object is achieved, for example, by a coil with several windings, wherein a first winding of the coil provides a first winding diameter and a first winding spacing, wherein a last winding of the coil provides a second winding diameter and a second winding spacing, wherein the first winding diameter is larger than the second winding diameter, and wherein the first winding spacing is smaller than the second winding spacing. The object is also achieved, for example, by a switching device with a first PIN diode, a first signal port, a second signal port, a first control port and a first coil, wherein a first control signal can be supplied via the first coil to the first PIN diode, and wherein the first control signal enables the first PIN diode to be placed into a conducting state and a non-conducting state.

As mentioned above, the coil provides several windings. As also mentioned above, a first winding, that is, a winding at one edge of the coil accordingly provides a given first winding diameter and a given first winding spacing relative to the next winding. At the other end of the coil, a last winding provides a given second winding diameter and a given second winding spacing relative to the adjacent winding. Accordingly, the first winding diameter is larger than the second winding diameter. However, the first winding spacing is smaller than the second winding spacing. This means that the coil provides no resonances at low frequencies. Such resonances lead to a drop in power and therefore to a heating of the coil. This would reduce the power-carrying capacity of the coil. Accordingly, the measures described above achieve a high power-carrying capacity of the coil.

Between the first and the last winding, the coil may provide at least one further winding with a third winding diameter and a third winding spacing relative to the adjacent windings. This third winding diameter is accordingly disposed between the first winding diameter and the second winding diameter. Similarly, the third winding spacing is disposed between the first winding spacing and the second winding spacing. Through the use of three different winding diameters and three different winding spacings, a further improvement of the electrical properties of the coil can be achieved. In particular, resonances can be further reduced, which additionally increases the power-carrying capacity.

In this context, the first winding diameter may be disposed within the range from about 5 to about 30 mm, preferably from about 12 to about 16 mm. The second winding diameter may be furthermore disposed within the range from about 3 to about 10 mm or more specifically between about 4 to about 7 mm. In this context, the first winding spacing is advantageously disposed within the range from 0 to about 4 mm or more specifically from 0 to about 1 mm. The second winding spacing is advantageously disposed in this context within the range from about 1 to about 10 mm or more specifically from about 2 to about 4 mm. If the coil provides a third winding diameter and a third winding spacing, the third winding diameter may be from about 4 to about 20 mm or more specifically about 8 to about 16 mm. In this case, the third winding spacing is 0 to about 8 mm, or more specifically about 1 to about 6 mm. This means that resonances occur only beyond the operating frequency, and accordingly, a very high power-carrying capacity is therefore achieved within the range of the operating frequency.

The coil may be conical, that is, a winding diameter of the windings of the coil is continuously reduced from the first winding to the last winding. Furthermore, in this context, the winding spacing from the first winding to the last winding is increased continuously. In this manner, a further increase in power-carrying capacity is achieved. In order to achieve a particularly good cooling of the coil, the interior cavity of the coil is preferably filled with air in this context. Alternatively, for an increased stability, the interior cavity of the coil is filled with a coil former. As a result, a simplification of manufacturing is additionally achieved.

The coil former may be manufactured from a synthetic material. The synthetic material may be a solid synthetic material such as polytetrafluoroethylene sold as Teflon® sold by DuPont Co. Another example of a suitable material for the coil former is a foamed synthetic material such as polymethacrylimide sold as Rohacell® by Evonik. The relative permittivity of the coil former in this context is no greater than about 1.2. Accordingly, a small influence of the coil former on the electrical properties of the coil is achieved.

In order to achieve simple manufacturing and stability of the coil, the windings of the coil are guided in a guide groove of the coil former. This guide groove specifies the diameter of the windings and the spacing of the windings. That is, the coil is wound onto the guide groove in the already prefabricated coil former.

In order to achieve a further improved cooling, the coil former can, alternatively or additionally, provide recesses along its longitudinal axis. In this case, the windings of the coil are held only by individual contact points which are distributed around the radius of the coil former.

The coil provides a power-carrying capacity of at least 500 W, more specifically at least 1 kW, and even more specifically at least 10 kW within the frequency range of about 600 MHz or respectively at a frequency of about 600 MHz.

The switching device according to one embodiment provides at least one first PIN diode, a first signal port, a second signal port, a first control port and a first coil described above. A first control signal can be supplied to the first diode by means of the first coil. The PIN diode can be placed into a conducting or a non-conducting state via the control signal. This means that a signal of very high power can be switched on and off between the first and second signal port.

In this context, the first signal port and the second signal port are connected to one another in a conducting manner in the case of a conducting PIN diode and are connected to one another in a non-conducting manner in the case of a non-conducting PIN diode.

The switching device provides a second PIN diode, a third signal port, a second control port and a second coil. The second control signal can be supplied to the second PIN diode in this context via the second coil. The second PIN diode can be placed into a conducting and a non-conducting state via the second control signal. In this manner, it is possible to switch a signal of very high power between two signal ports.

The coil therefore may provide about 10 to about 100 windings or more specifically about 20 to about 40 windings. Accordingly, a desired inductance can be achieved with manageable manufacturing costs.

BRIEF DESCRIPTION OF THE DRAWINGS

The written disclosure herein describes illustrative embodiments that are non-limiting and non-exhaustive. Reference is made to certain of such illustrative embodiments that are depicted in the figures, as listed below.

DETAILED DESCRIPTION

With reference to the above-listed drawings, this section describes particular embodiments and their detailed construction and operation. The embodiments described herein are merely examples, set forth by way of illustration only and not limitation. Those skilled in the art will recognize in light of the teachings herein that there are alternatives, variations and equivalents to the example embodiments described herein. For example, other embodiments are readily possible, variations can be made to the embodiments described herein, and there may be equivalents to the components, parts, or steps that make up the described embodiments.

Described herein are certain embodiments of methods, apparatus, and systems related to a coil for a switching device with a high-frequency power. Initially, the general construction and functioning of an exemplary embodiment of the switching device is explained with reference to FIG. 1. Following this, the problem underlying the disclosed embodiments will be explained in greater detail with reference to FIGS. 1-3. Following this, the construction and functioning of various exemplary embodiments of the coil will be explained with reference to FIGS. 4-5. Finally, the advantageous effects of the coil and the switching device (also referred to below as the switch) will be described with reference to FIGS. 6-7. The presentation and description of identical elements in similar drawings have not been repeated in some cases.

Figure 1:
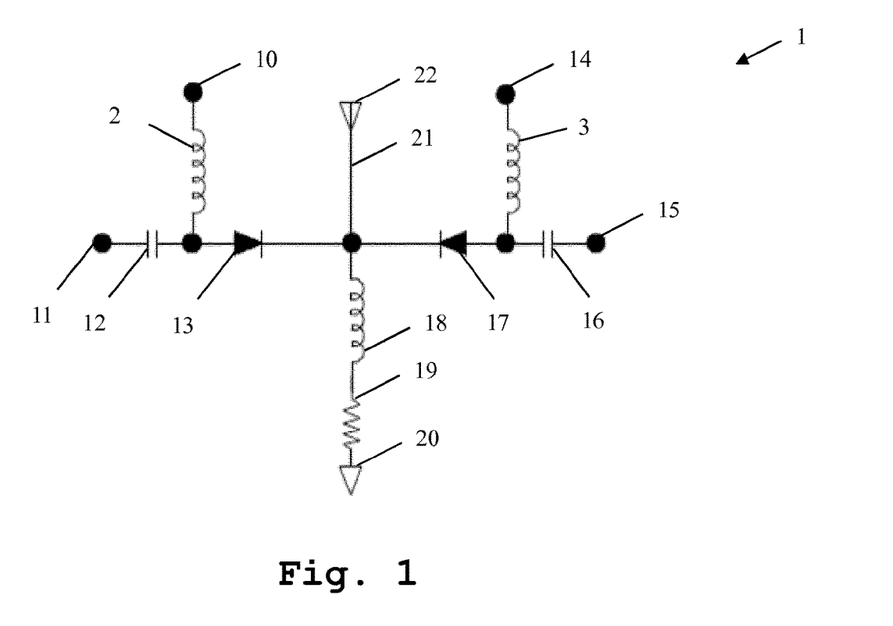
FIG. 1 is an exemplary embodiment of the switching devices according to one embodiment.

FIG. 1 shows a block-circuit diagram of a broadband PIN-diode switch 1. The switch 1 comprises a first signal port 11, a second signal port 21, to which, here, an antenna 22 is connected, and a third signal port 15. Furthermore, the switch 1 comprises a first control port 10 and a second control port 14. A decoupling capacitor 12 is connected to the first signal port 11. A coil 2, which is connected in turn to the first control port 10, is connected to the end of the decoupling capacitor 12 facing downstream. A first PIN diode 13 is also connected to the end of the decoupling capacitor 12 facing downstream.

The second signal port 21, and by means of it the antenna 22, are connected to the end of the first PIN diode 13 facing downstream in the direction of flow. Furthermore, a second PIN diode 17 is connected with opposite polarity to the second signal port 21. A further decoupling capacitor 16 is present at the end of the second PIN diode 17 facing downstream. In turn, its port facing downstream is connected to the third signal port 15. A further coil 3 is connected between the second PIN diode 17 and the second decoupling capacitor 16. The second control port 14 is disposed at the end of the former facing downstream. Furthermore, a coil 18 and in series with it an ohmic resistor 19, which are connected to the measurement port 20, are connected to the second signal port 21.

By way of example, a transmitter is connected to the first signal port 11. If the switch 1 switches a signal radiated from the transmitter to the antenna 22, a control signal, which switches the PIN diode 13 into a conducting state must be fed via the first control input 10. For example, a receiver is connected to the third signal port 15. If a signal received through the antenna 22 is to be transmitted to the receiver at the third signal port 15, a control signal which places the PIN diode 17 into a conducting state is fed via the coil 3 to the second control input 14. A control signal is preferably connected either to the first control input 10 or to the second control input 14, so that, in each case, only one of the two PIN diodes 13, 17 is in a conducting state at the same time.

In particular, in the transmission case presented above, a very high power occurs within the switch 1. That is, in particular, the coils 2 and 18 require a particularly high power-carrying capacity.

Figure 2:
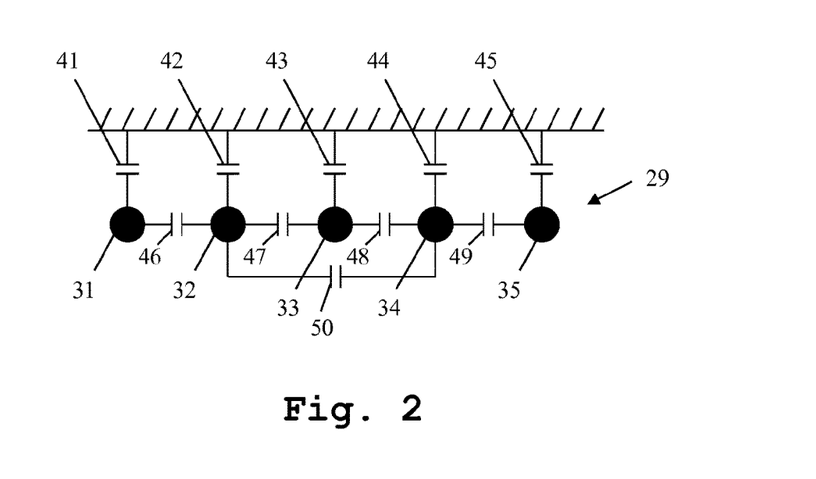
FIG. 2 is an equivalent circuit-diagram of several windings of the coil.

FIG. 2 presents an equivalent circuit diagram of several windings 31-35 of a coil 29. The windings 31-35 in this context are drawn as black, filled circles. These are shown in cross-section. All of the other components shown in FIG. 2 are present only in the equivalent circuit diagram but not in reality. Accordingly, each individual one of the windings 31-35 comprises a capacitance 41-45 relative to the surrounding environment. Additionally, each of the windings 31-35 comprises capacitances 46-49 relative to adjacent windings. Furthermore, each of the windings 31-35 comprises capacitances relative to non-adjacent windings. For the sake of clarity, only one capacitance 50 is shown here between the windings 32 and 34. However, in the actual equivalent circuit diagram, capacitances are, of course, present between all of the windings.

For the sake of clarity, the inductance generated by the coil between the individual windings has also not been presented here. Accordingly, in the equivalent circuit diagram, a complex configuration of capacitances and inductances which acts as a filter is obtained. A frequency response which shows resonances occurs in this manner. Such resonances cause losses which lead to a thermal power and therefore to a heating of the coil up to its destruction.

Figure 3:
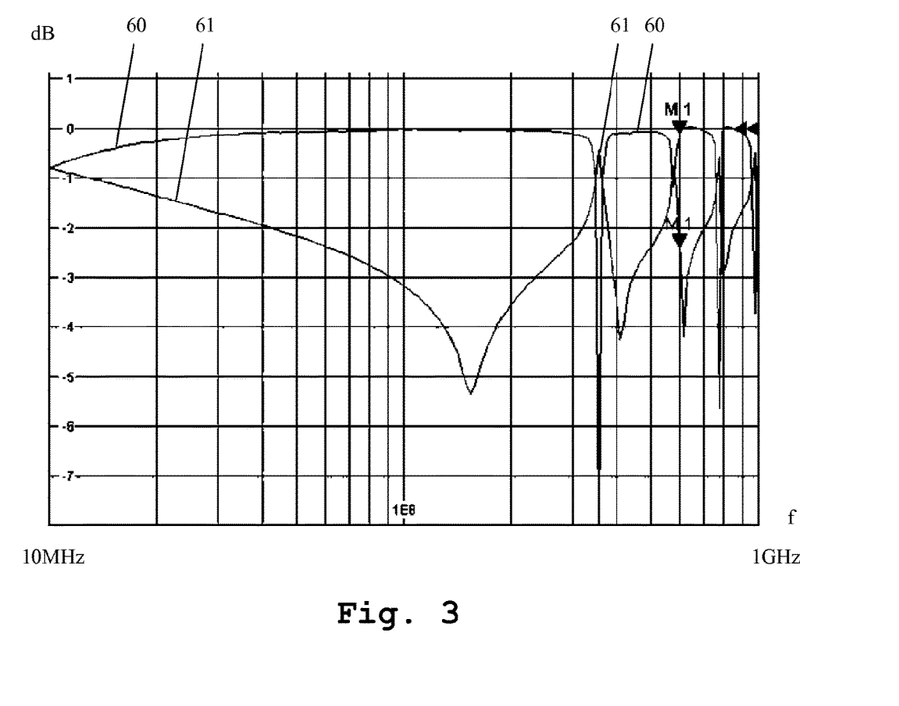
FIG. 3 is an S-parameter diagram of an exemplary cylindrical coil.

In FIG. 3, the S-parameters S11 61 and S21 60 of a conventional cylindrical coil of constant winding spacing and constant winding diameter are shown. It is very clearly evident that numerous resonances occur especially with regard to relatively high frequencies.

Figure 4:
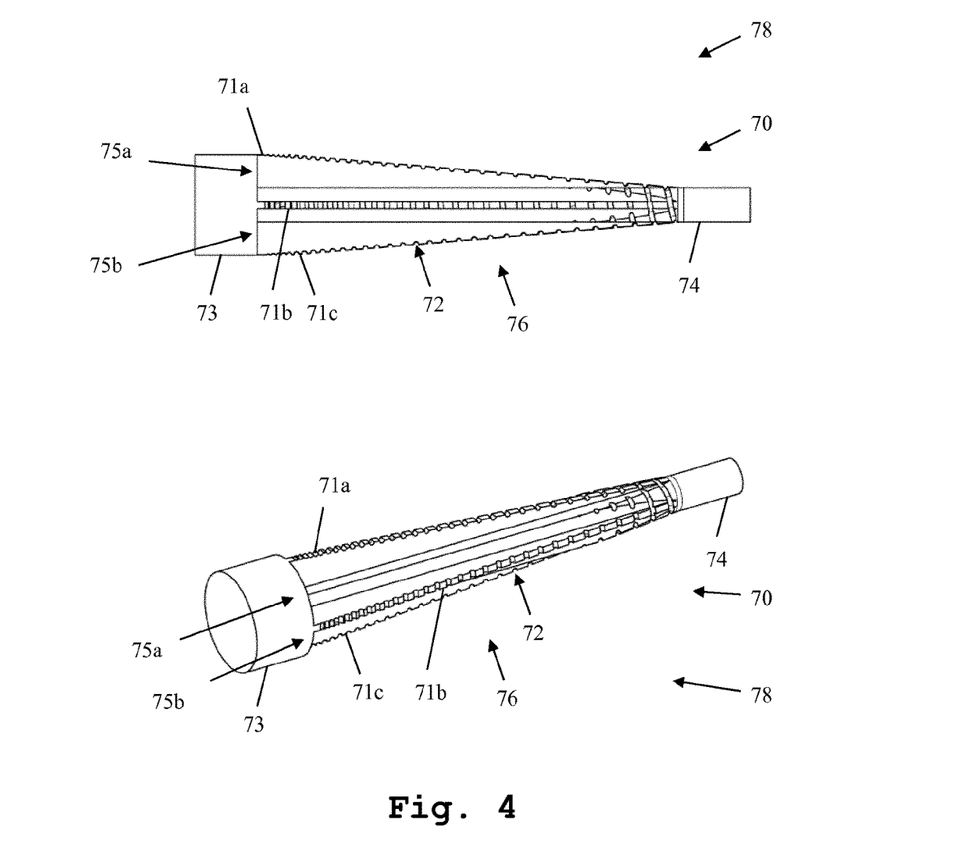
FIG. 4 is a first exemplary embodiment of the coil in a lateral view and in an isometric view.

FIG. 4 shows a first exemplary embodiment of the coil 78 according to one embodiment. However, FIG. 4 shows only the coil former 70 and not the windings themselves. The coil former 70 in this context provides a first cylindrical part 73 and a second cylindrical part 74. A conical part 76 of the coil former 70 is shown between these. The conical part 76 of the coil former 70 accordingly provides a guide groove 72 which extends in a spiral shape along the entire conical part 76 of the coil former 70. The guide groove 72 accordingly specifies the course of the windings along the coil former 70. The winding spacings can be recognized with reference to the spacings of the guide groove 72. The winding diameters can be recognized with reference to the diameter of the coil former along the guide groove 72.

The coil former 70 illustrated here furthermore provides recesses 75a, 75b in the conical part 76. These recesses 75a, 75b allow a back ventilation of the windings and at the same time reduce the volume of a dielectric material within the windings. The remaining webs 71a, 71b, 71c of the conical part 76 of the coil former 70 are separated from the recesses 75a, 75b. In the exemplary embodiment illustrated here, four such webs, which are each 90° offset relative to one another with reference to the coil former 70, are shown.

Figure 5:
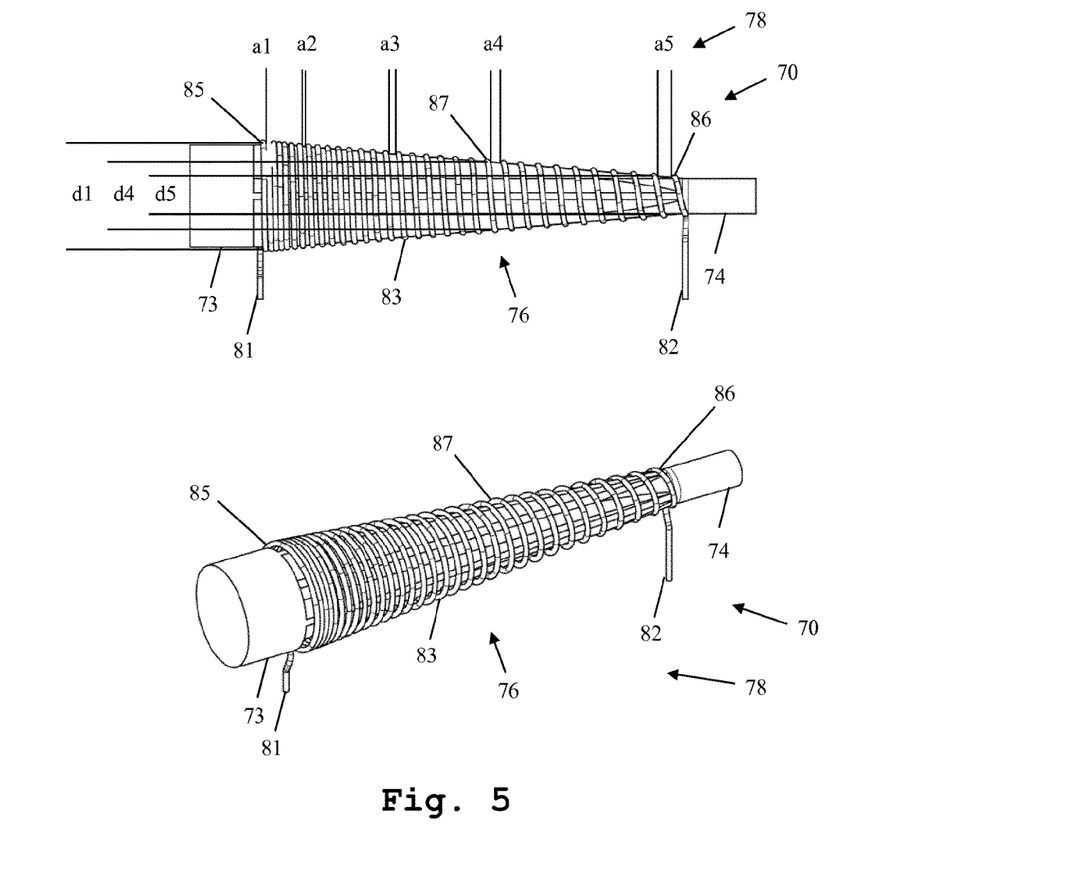
FIG. 5 is a second exemplary embodiment of a coil in a lateral view and in an isometric view.

FIG. 5 shows a second exemplary embodiment of the coil 78. In FIG. 5, the windings 83 are now shown. These are applied along the entire conical part 76 of the coil former 70. It is evident here that the windings 83 extend in the guide groove 72 from FIG. 4. The windings 83 are furthermore connected to ports 81, 82 in the region of the meeting of the conical part 76 of the coil 78 with the cylindrical parts 73 and 74.

In the exemplary embodiment illustrated here, the first winding 85 on the extreme left provides a diameter d1 of 14.38 mm. The last winding 86 on the extreme right provides a diameter d5 of 5 mm. The coil former 70 provides a total length of 80 mm. A wire thickness of 0.75 mm may be used. In this context, the wire is lacquered. In the exemplary embodiment illustrated here, the winding spacing a1 of the first five windings is 0. After this, it rises steadily from 0.4 mm to 2.25 mm. In this context, the winding spacing designates the spacing between the directly adjacent sides of the windings 83. This contrasts with the pitch, which, in each case takes into consideration the midpoint of the windings.

In the case of a winding 87, the winding spacing is a4 and the winding diameter d4. The winding spacing a4 is less than a5 and greater than a1. The winding diameter d4 is less than d1 and greater than d5.

Figure 6:
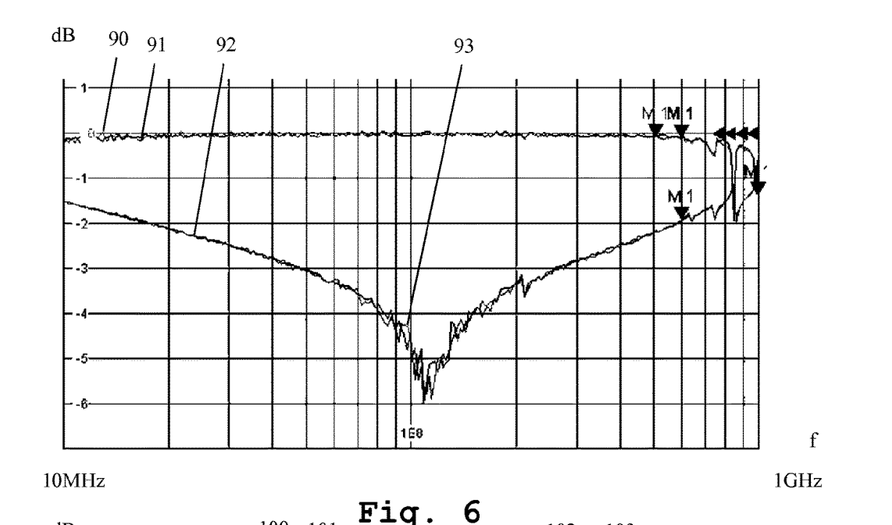
FIG. 6 is an S-parameter diagram of a coil dependent upon frequency.

FIG. 6 shows the S-parameters S21 90, S12 91, S11 92 and S22 93 of the exemplary embodiment of the coil from FIG. 5. It is clearly evident here that resonance points occur only at very high frequencies.

Figure 7:
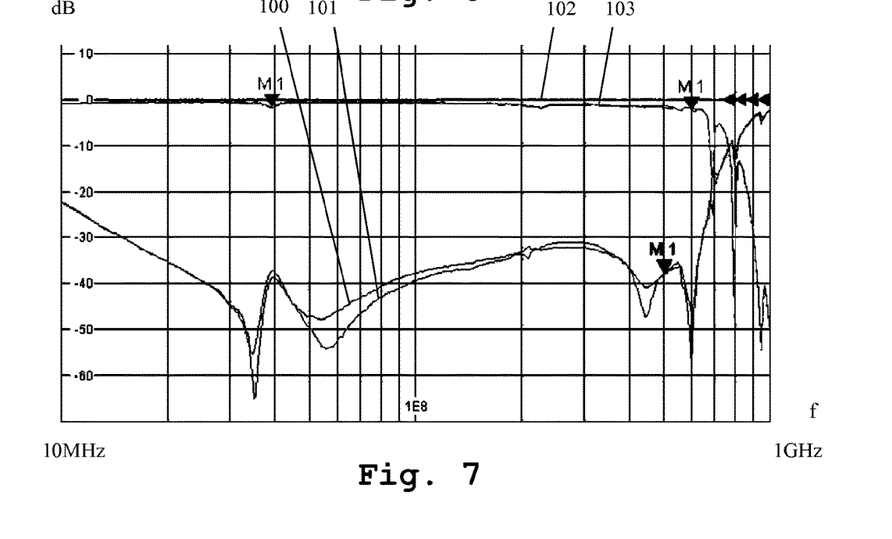
FIG. 7 is an S-parameter diagram of a switching device dependent upon frequency.

In FIG. 7, S-parameters S11 101, S22 100, S21 102 and S12 103 of the transmission path of the switch as shown in FIG. 1 are illustrated between the ports 11 and 21. Here also, it is evident that resonances occur only at very high frequencies and therefore a very high power-carrying capacity is present.

The invention is not restricted to the exemplary embodiments shown and described. Accordingly, the coils described can also be used for other applications in which a high power-carrying capacity and a high bandwidth are important. Switches with several different paths can also be manufactured with the use of the coils according to the invention. It will be understood by those having skill in the art that changes may be made to the details of the above-described embodiments without departing from the underlying principles presented herein. For example, any suitable combination of various embodiments, or the features thereof, is contemplated.

References to approximations are made throughout this specification, such as by use of the terms "about" or "approximately." For each such reference, it is to be understood that, in some embodiments, the value, feature, or characteristic may be specified without approximation. For example, where qualifiers such as "about," "substantially," and "generally" are used, these terms include within their scope the qualified words in the absence of their qualifiers. For example, where the term about 1 mm is recited with respect to a feature, it is understood that in further embodiments, the feature can have a precise measurement of 1 mm.

Reference throughout this specification to "an embodiment" or "the embodiment" means that a particular feature, structure or characteristic described in connection with that embodiment is included in at least one embodiment. Thus, the quoted phrases, or variations thereof, as recited throughout this specification are not necessarily all referring to the same embodiment.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim require more features than those expressly recited in that claim. Rather, as the following claims reflect, inventive aspects lie in a combination of fewer than all features of any single foregoing disclosed embodiment.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the preceding claims up to and including claim [x]," where the bracketed term "[x]" is replaced with the number of the most recently recited independent claim. For example, for the first claim set that begins with independent claim 1, claim 3 can depend from either of claims 1 and 2, with these separate dependencies yielding two distinct embodiments; claim 4 can depend from any one of claim 1, 2, or 3, with these separate dependencies yielding three distinct embodiments; claim 5 can depend from any one of claim 1, 2, 3, or 4, with these separate dependencies yielding four distinct embodiments; and so on.

Recitation in the claims of the term "first" with respect to a feature or element does not necessarily imply the existence of a second or additional such feature or element. Elements specifically recited in means-plus-function format, if any, are intended to be construed in accordance with 35 U.S.C. § 112 ¶ 6. Embodiments of the invention in which an exclusive property or privilege is claimed are defined as follows.

The invention claimed is:

1. A coil system comprising a coil and several windings,
    wherein a first winding of the coil provides a first winding diameter and a first winding spacing;
    wherein a last winding of the coil provides a second winding diameter and a second winding spacing;
    wherein the first winding diameter is larger than the second winding diameter;
    wherein the first winding spacing is smaller than the second winding spacing;
    wherein the coil system further comprises a coil former filling an interior cavity of the coil;
    wherein the coil former provides four recesses extending along its longitudinal axis, separated by webs, which are 90° offset relative to one another with reference to the coil former;
    wherein the coil former comprises synthetic material;
    wherein the coil former provides a relative permittivity that is no greater than about 1.2;
    wherein the windings of the coil are guided in a guide groove of the coil former; and
    wherein a wire thickness of the coil is larger than a depth of the guide groove.

2. The coil system according to claim 1,
    wherein at least one winding of the coil between the first winding and the last winding provides a third winding spacing and a third winding diameter.

3. The coil system according to claim 2,
    wherein the third winding diameter is smaller than the first winding diameter and larger than the second winding diameter.

4. The coil system according to claim 2,
    wherein the third winding spacing is larger than the first winding spacing and is smaller than the second winding spacing.

5. The coil system as recited in claim 2,
    wherein the third winding diameter ranges from 4 mm to about 20 mm; and
    wherein the third winding spacing ranges from 0.5 mm to about 8 mm.

6. The coil system according to claim 1,
    wherein at least one winding of the coil between the first winding and the last winding provides a third winding spacing and a third winding diameter;
    wherein the third winding diameter is smaller than the first winding diameter and larger than the second winding diameter; and
    wherein the third winding spacing is larger than the first winding spacing and is smaller than the second winding spacing.

7. The coil system as recited in claim 1, wherein the first winding diameter is about 5 mm to about 30 mm.

8. The coil system as recited in claim 1, wherein the second winding diameter is about 3 mm to about 10 mm.

9. The coil system as recited in claim 1, wherein the first winding spacing ranges from 0 to about 4 mm.

10. The coil system as recited in claim 1, wherein the second winding spacing ranges from 1 mm to about 10 mm.

11. The coil system as recited in claim 1,
    wherein a winding diameter of the windings of the coil is reduced continuously or via one or more steps from the first winding to the last winding; and
    wherein a winding spacing of the windings of the coil is increased continuously or via one or more steps from the first winding to the last winding.

12. The coil system as recited in claim 1, wherein the windings are not borne by the coil former in the region of the recess.

13. The coil system as recited in claim 1, wherein the coil provides a power-carrying capacity of at least about 500 W with a frequency of about 600 MHz.

14. The coil system according to claim 1,
    wherein the coil former includes a first cylindrical part, a second cylindrical part, and a conical part disposed between the first cylindrical part and the second cylindrical part,
    wherein a diameter of the first cylindrical part is greater than a diameter of the second cylindrical part,
    wherein the conical part includes the webs,
    wherein the webs include a first triangular wall extending from a first vertex of the first triangular wall at an outer edge of the first cylindrical part to a second vertex of the first triangular wall at an outer edge of the second cylindrical part,
    wherein the webs include a second triangular wall 90° offset relative to the first triangular wall, and extending from a first vertex of the second triangular wall at the outer edge of the first cylindrical part to a second vertex of the second triangular wall at the outer edge of the second cylindrical part,
    wherein the webs include a third triangular wall 90° offset relative to the second triangular wall, and extending from a first vertex of the third triangular wall at the outer edge of the first cylindrical part to a second vertex of the third triangular wall at the outer edge of the second cylindrical part,
    wherein the webs include a fourth triangular wall 90° offset relative to the third triangular wall, and extending from a first vertex of the fourth triangular wall at the outer edge of the first cylindrical part to a second vertex of the fourth triangular wall at the outer edge of the second cylindrical part,
    wherein each of the first, second, third, and fourth triangular walls include a plurality of guide grooves to receive the several windings of the coil,
    wherein each of the first, second, third, and fourth triangular walls have a wall thickness that is a fraction of a circumference of the first cylindrical part,
    wherein each of the four recesses correspond to empty space within the conical part that is associated with a larger fraction of the circumference of the first cylindrical part relative to the fraction associated with the wall thickness of the first, second, third, and fourth triangular walls and wherein a first winding from among the several windings of the coil has a diameter that is substantially the same as the diameter of the first cylindrical part, and a second winding from among the several windings of the coil has a diameter that is substantially the same as the diameter of the second cylindrical part.

15. The coil system according to claim 1, wherein the synthetic material of the coil former comprises a foamed synthetic material.

16. The coil system according to claim 15, wherein the foamed synthetic material is polymethacrylimide.

17. A switching device comprising
a first coil comprising several windings;
   wherein a first winding of the coil provides a first winding diameter and a first winding spacing,
   wherein a last winding of the coil provides a second winding diameter and a second winding spacing,
   wherein the first winding diameter is larger than the second winding diameter, and
   wherein the first winding spacing is smaller than the second winding spacing;
a coil former filling an interior cavity of the coil, wherein the coil former provides four recesses extending along its longitudinal axis, separated by webs, which are 90° offset relative to one another with reference to the coil former, wherein the coil former comprises synthetic material, and wherein the coil former provides a relative permittivity that is no greater than about 1.2;
a first PIN diode;
a first signal port;
a second signal port; and
a first control port;
wherein a first control signal can be supplied via the first coil to the first PIN diode;
wherein the first PIN diode can be placed into a conducting state and a non-conducting state via the first control signal;
wherein the windings of the first coil are guided in a guide groove of the coil former; and
wherein a wire thickness of the first coil is larger than a depth of the guide groove.

18. The switching device as recited in claim 17,
wherein, in the case of a conducting first PIN diode, the first signal port is connected to the second signal port in a conducting manner.

19. The switching device as recited in claim 17,
wherein, in the case of a non-conducting first PIN diode, the first signal port is connected to the second signal port in a non-conducting manner.

20. The switching device as recited in claim 17,
wherein the switching device provides a second PIN diode, a third signal port, a second control port, and a second coil;
wherein a second control signal can be supplied via the second coil to the second PIN diode; and
wherein the second PIN diode can be placed into a conducting state and a non-conducting state via the second control signal.

21. The switching device as recited in claim 20, wherein the second coil comprises several windings,
   wherein a first winding of the second coil provides a first winding diameter and a first winding spacing,
   wherein a last winding of the second coil provides a second winding diameter and a second winding spacing,
   wherein the first winding diameter of the second coil is larger than the second winding diameter of the second coil, and
   wherein the first winding spacing of the second coil is smaller than the second winding spacing of the second coil.

22. The switching device as recited in claim 20,
wherein, in the case of a conducting first PIN diode, the first signal port is connected to the second signal port in a conducting manner; and
wherein, in the case of a non-conducting first PIN diode, the first signal port is connected to the second signal port in a non-conducting manner; and
wherein, in the case of a conducting second PIN diode, the third signal port is connected to the second signal port in a conducting manner; and
wherein, in the case of a non-conducting second PIN diode, the third signal port is connected to the second signal port in a non-conducting manner.

* * * * *